United States Patent
Hasegawa et al.

(10) Patent No.: US 9,800,242 B1
(45) Date of Patent: Oct. 24, 2017

(54) OPERATION SWITCH, DRESSING TABLE AND MIRROR USING CAPACITANCE SENSOR

(71) Applicant: Panasonic Intellectual Property Management Co., Ltd., Osaka (JP)

(72) Inventors: Yuka Hasegawa, Kanagawa (JP); Gosuke Sakamoto, Kyoto (JP); Kouhei Koresawa, Kyoto (JP); Norishige Nanai, Osaka (JP); Takaaki Ukeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/448,695

(22) Filed: Mar. 3, 2017

(30) Foreign Application Priority Data

Apr. 14, 2016 (JP) .................................. 2016-081538

(51) Int. Cl.
    *H01H 35/00* (2006.01)
    *H03K 17/96* (2006.01)
(52) U.S. Cl.
    CPC .................................. *H03K 17/962* (2013.01)
(58) Field of Classification Search
    CPC .................................................. H03K 17/962
    See application file for complete search history.

(56) References Cited

U.S. PATENT DOCUMENTS 8,749,523 B2 * 6/2014 Pance ................... G06F 1/1616
                                                         324/681

FOREIGN PATENT DOCUMENTS

| JP | 2004-164893 | 6/2004 |
|----|-------------|--------|
| JP | 2008-042725 | 2/2008 |
| JP | 2008-108534 | 5/2008 |
| JP | 2009-181232 | 8/2009 |
| JP | 2009-230852 | 10/2009 |
| JP | 2009-239649 | 10/2009 |
| JP | 2014-230226 | 12/2014 |

* cited by examiner

*Primary Examiner* — Daniel Cavallari
(74) *Attorney, Agent, or Firm* — McDermott Will & Emery LLP

(57) ABSTRACT

An operation switch includes: a capacitance sensor that generates three or more detection signals in response to approach or contact of an object to respective three or more electrodes; a determination circuit that determines whether or not the object is a living body based on one or more detection signals selected from the three or more detection signals, the one or more detection signals excluding a detection signal having a maximum intensity among the three or more detection signals; and a controller that, when the object is determined to be a living body, generates an operation signal for operating a predetermined device.

9 Claims, 11 Drawing Sheets

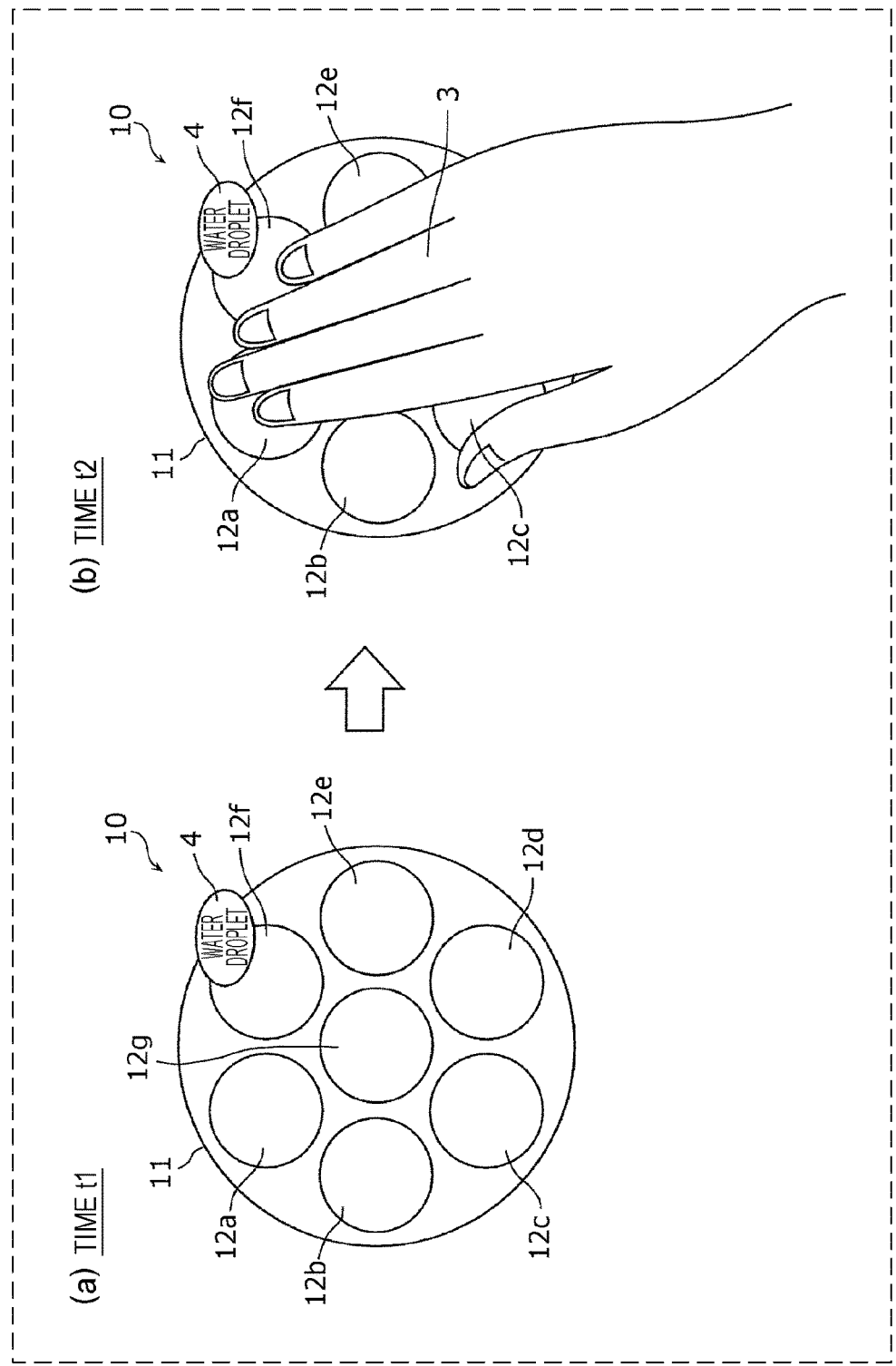

OPERATION SWITCH, DRESSING TABLE AND MIRROR USING CAPACITANCE SENSOR

BACKGROUND

1. Technical Field

The present disclosure relates to an operation switch, and a dressing table and a mirror including the operation switch.

2. Description of the Related Art

A switch using a capacitance sensor has a simple structure and can be increased in size. For this reason, the capacitance sensor finds application in various products such as a touch switch and a level switch. Even when water adheres to a capacitance sensor, the sensor responds in the same manner as in the case where a human touches the sensor. This causes malfunction.

On the other hand, for instance, Japanese Unexamined Patent Application Publication No. 2009-239649 discloses a touch switch sensing device that includes a touch switch unit having a plurality of touch sensing electrodes that detect contact with a user and a plurality of water sensing electrodes that detect contact with a water droplet. The touch switch sensing device determines whether an operation has been performed by a human, using the touch sensing electrodes and the water sensing electrodes.

SUMMARY

In one general aspect, the techniques disclosed here feature an operation switch including: a capacitance sensor, including three or more electrodes, configured to generate three or more detection signals in response to approach or contact of an object to the respective three or more electrodes; a determination circuit that determines whether or not the object is a living body based on one or more detection signals selected from the three or more detection signals, the one or more detection signals excluding a detection signal having a maximum intensity among the three or more detection signals; and a controller that, when the object is determined to be a living body, generates an operation signal for operating a predetermined device.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6A illustrates plan views schematically illustrating the manner in which a water droplet adheres to the operation switch according to the first embodiment and the manner in which the operation switch is operated with fingers;

DETAILED DESCRIPTION

Hereinafter, embodiments will be specifically described with reference to the drawings.

It is to be noted that each of the embodiment described below illustrates a general or specific example. The numerical values, shapes, materials, structural components, the arrangement and connection of the structural components, steps, the sequence of the steps shown in the following embodiments are mere examples, and are not intended to limit the scope of the present disclosure. In addition, among the structural components in the subsequent embodiment, components not recited in any one of the independent claims which indicate the broadest concepts are described as arbitrary structural components.

It is to be noted that the respective figures are schematic diagrams and are not necessarily precise illustrations. Therefore, for instance, the scales used in the figures are not necessarily the same. Furthermore, in the respective figures, the same reference sign is given to substantially identical components, and overlapping description is omitted or simplified.

First Embodiment

[1. General Outline]

First, the general outline of an operation switch 1 according to a first embodiment will be described using FIG. 1.

Figure 1:
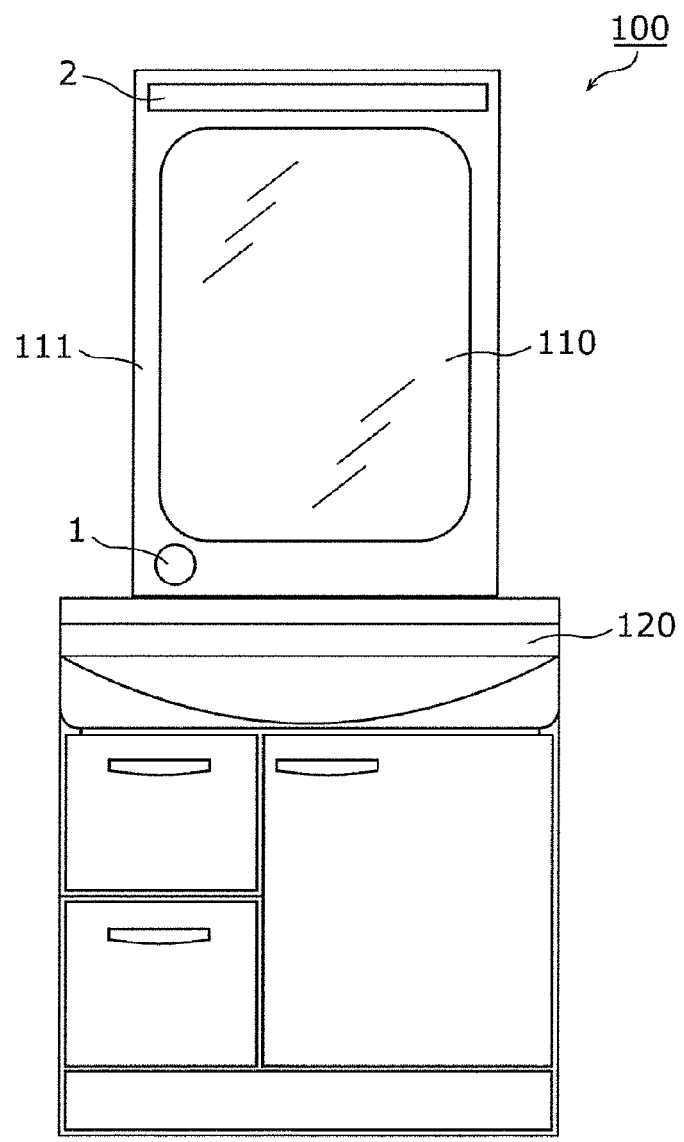
FIG. 1 is a front view of a dressing table including an operation switch according to a first embodiment.

FIG. 1 is a front view of a dressing table 100 including an operation switch 1 according to this embodiment. As illustrated in FIG. 1, a dressing table 100 is a bathroom vanity including a mirror 110, a frame 111 provided with the mirror 110, and a wash stand 120. The dressing table 100 further includes an operation switch 1 and a device 2.

The operation switch 1 generates an operation signal for operating the device 2, and controls the device 2 by the generated operation signal. The operation switch 1 detects approach or contact of a detection target, and when the detection target is a living body such as a finger or a hand of a user, the operation switch 1 controls the device 2. The operation switch 1 performs, for instance, on/off control of the device 2. It is noted that the term "approach" in the present disclosure means a state of being within a predetermined distance from an electrode.

As illustrated in FIG. 1, the operation switch 1 is provided in the frame 111. It is to be noted that the position at which the operation switch 1 is provided is not limited to this. The operation switch 1 may be provided in the mirror 110 or the wash stand 120.

The device 2 is, for instance, a lighting device provided in the dressing table 100. Lighting on and lighting off or modulating light of the device 2 is controlled by an operation signal transmitted from the operation switch 1. It is to be noted that the device 2 is not limited to a lighting device, and may be an electrical equipment such as an audio equipment, an air-conditioning equipment.

Hereinafter, the configuration of the operation switch 1 will be described using FIG. 2 and FIG. 3.

Figure 2:
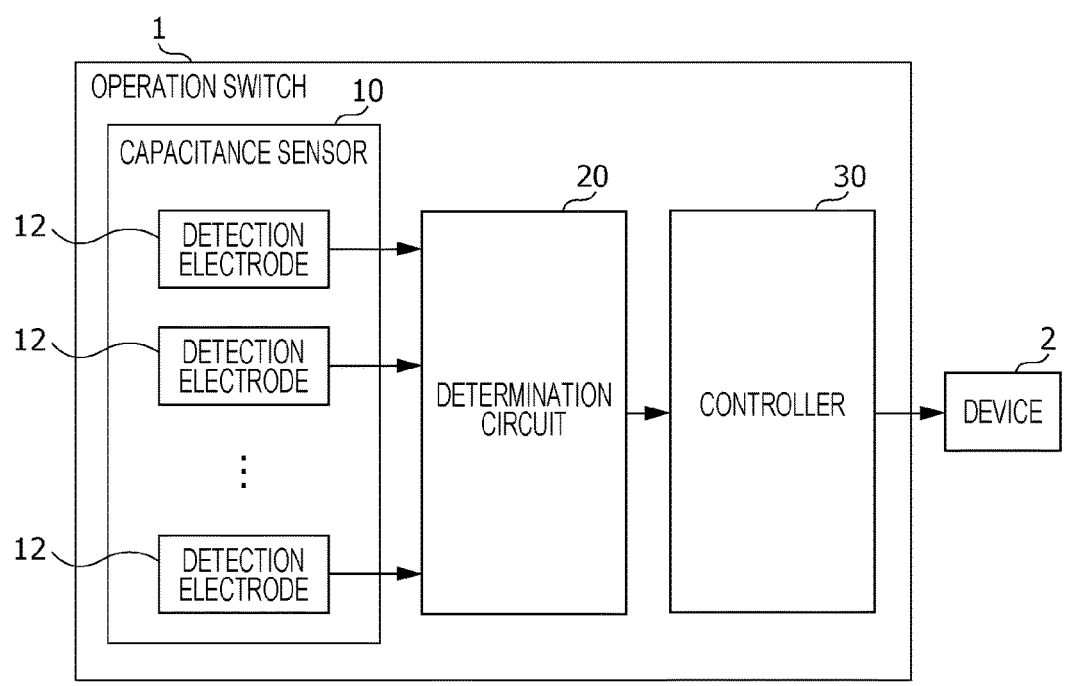
FIG. 2 is a block diagram illustrating the configuration of the operation switch according to the first embodiment.

FIG. 2 is a block diagram illustrating the configuration of the operation switch 1 according to this embodiment. FIG. 3 is a schematic diagram schematically illustrating an example of use of the operation switch 1 according to the first embodiment. As illustrated in FIG. 2 and FIG. 3, the operation switch 1 includes a capacitance type sensor 10, a determination circuit 20, and a controller 30.

The capacitance type sensor 10 has three or more detection electrodes 12, and detects approach or contact of a detection target by detecting a capacitance with the detection electrodes 12. The detection target includes a living body including a human body, and water. Specifically, the detection target includes a detection target to be detected correctly, such as a finger 3 illustrated in FIG. 3, and a detection target such as a water droplet 4 (see FIG. 6A), dew condensation, vapor which may cause malfunction of the device 2.

Figure 3:
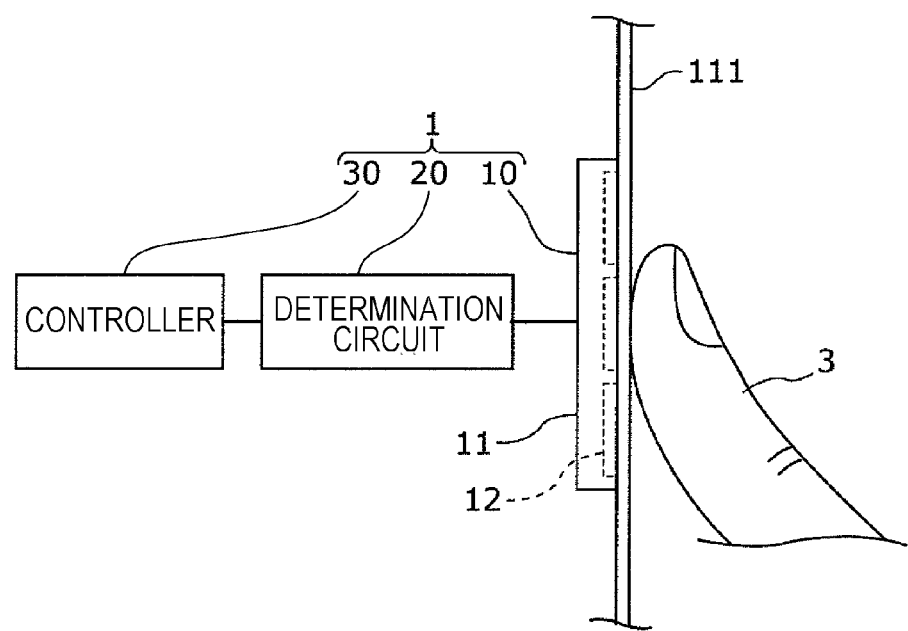
FIG. 3 is a schematic diagram schematically illustrating an example of use of the operation switch according to the first embodiment.

In this embodiment, as illustrated in FIG. 3, the capacitance type sensor 10 is installed in the back side of the frame 111 of the dressing table 100. Specifically, the capacitance type sensor 10 is disposed such that a sensor surface (the major surface of a substrate 11 described later) is approximately vertical (that is, longitudinal arrangement).

When the human finger 3 as a detection target approaches or comes into contact with the detection electrodes 12, each of the three or more detection electrodes 12 of the capacitance type sensor 10 outputs a detection signal indicating capacitance change which occurs between the detection electrode and the fingers 3. The configuration of the capacitance type sensor 10 will be described later.

The determination circuit 20 determines whether or not the detection target is a living body based on other one or more detection signals excluding a signal having a maximum intensity, out of detection signals outputted from the three or more detection electrodes 12. The detailed operation of the determination circuit 20 will be described later.

When the detection target is determined to be a living body by the determination circuit 20, the controller 30 generates an operation signal for operating the device 2. The controller 30 transmits the generated operation signal to the device 2, thereby controlling the device 2.

It is to be noted that the controller 30 and the device 2 can communicate via a wire or wirelessly. It is to be noted that the determination circuit 20 and the controller 30 are implemented by, for instance, a microcomputer (or a microprocessor). Specifically, the determination circuit 20 and the controller 30 are implemented by components including a non-volatile memory in which predetermined programs are stored, a volatile memory which is a temporary storage area for executing the programs, an input/output port, and a processor that executes the programs.

[2. Capacitance Type Sensor]

Subsequently, the details of the configuration of the capacitance type sensor 10 according to this embodiment will be described using FIG. 4A and FIG. 4B.

Figure 4A:
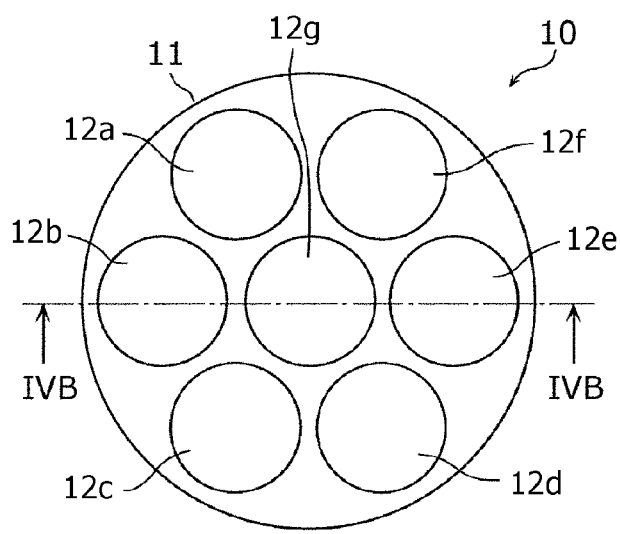
FIG. 4A is a plan view a capacitance type sensor included in the operation switch according to the first embodiment.

FIG. 4A is a plan view a capacitance type sensor 10 included in the operation switch 1 according to this embodiment. FIG. 4B is a sectional view, taken along line IVB-IVB of FIG. 4A, of the capacitance type sensor 10 according to this embodiment.

Figure 4B:
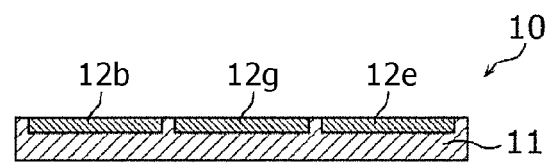
FIG. 4B is a sectional view, taken along line IVB-IVB of FIG. 4A, of the capacitance type sensor according to the first embodiment.

As illustrated in FIG. 4A and FIG. 4B, the capacitance type sensor 10 includes a substrate 11, and seven detection electrodes 12a to 12g formed in the substrate 11. It is to be noted that the number of detection electrodes is not limited to seven, and may be three or more.

The substrate 11 is, for instance, a resin substrate composed of a resin material or a metal base substrate covered with insulation. It is to be noted that although the substrate 11 is, for instance, circular in plan view, but is not limited to this and may be rectangular.

The detection electrodes 12a to 12g are each formed in one surface of the substrate 11 in a predetermined pattern as illustrated in FIG. 4B using, for instance, metal material such as copper or silver. Specifically, the detection electrodes 12a to 12g are each a solid electrode having a circular plan view, and are equivalent in shape and size. The size of each of the detection electrodes 12a to 12g is, for instance, larger than a water droplet and smaller than a finger or a palm. Specifically, the size of each of the detection electrodes 12a to 12g is 0.5 cm or greater and 10 cm or less in diameter.

It is to be noted that each of the detection electrodes 12a to 12g is not limited to circular in plan view and may be rectangular. Also, the detection electrodes 12a to 12g may be different in shape and size.

In this embodiment, as illustrated in FIG. 4A, seven detection electrodes 12a to 12g are disposed two-dimensionally in a predetermined area in plan view. The predetermined area is, for instance, a circular area, and corresponds to the major surface of the substrate 11. The predetermined area (major surface of the substrate 11) is an area larger than a finger or a palm, for instance. Specifically, the size of the predetermined area is, for instance, 1 cm or greater and 20 cm or less in diameter.

In this embodiment, as illustrated in FIG. 4A, the detection electrode 12g is located in the center of the circular substrate 11, and six detection electrodes 12a to 12f are located around the detection electrode 12g at evenly spaced intervals (at evenly spaced angles) in a surrounding manner. It is to be noted that the arrangement of the seven detection electrodes 12a to 12g is not limited to this, and may be arranged in a matrix form or a linear form, for instance.

It is to be noted that the seven detection electrodes 12a to 12g have the same structure, and differ only in the position within the substrate 11. For this reason, in the following description, the detection electrodes 12a to 12g are denoted by the detection electrode 12 unless distinction is particularly necessary.

Each of the three or more detection electrodes 12 outputs a detection signal indicating capacitance change which occurs between a detection target and the detection electrode. For instance, as illustrated in FIG. 3, when the finger 3 approaches or comes into contact with the detection electrode 12, a capacitance occurring between the detection electrode 12 and the finger 3 is increased, and thus the intensity of a detection signal from the detection electrode 12 is increased. The determination circuit 20 determines whether or not the detection target is a living body (finger 3) based on detection signals from the three or more detection electrodes 12.

[3. Operation]

Figure 5A:
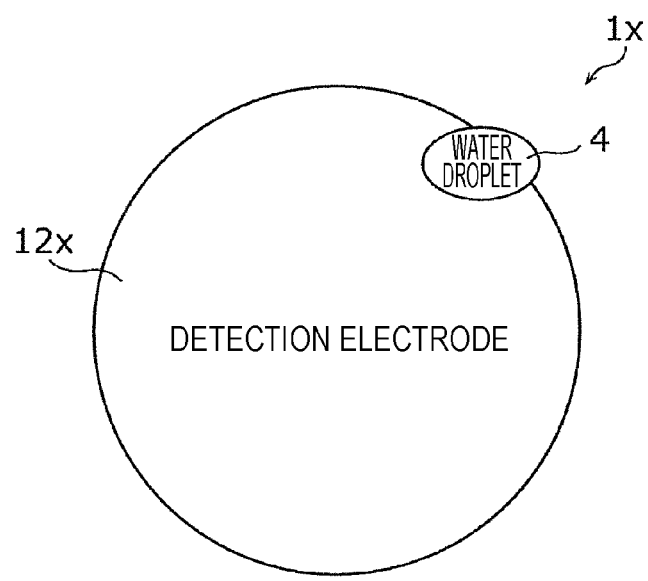
FIG. 5A is a plan view schematically illustrating the manner in which a water droplet adheres to an operation switch in related art.
Figure 5B:
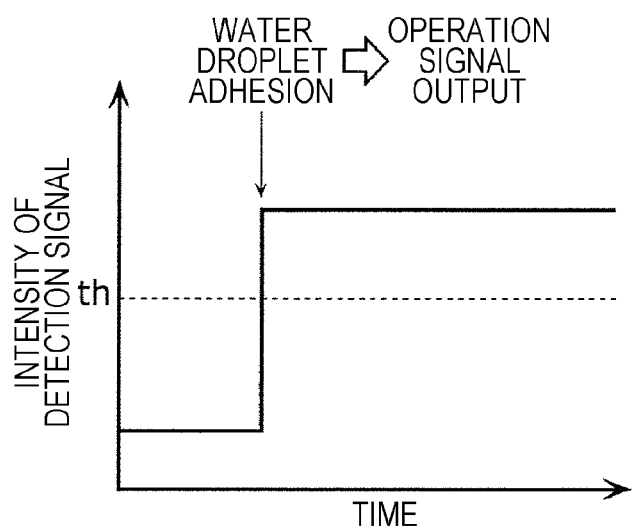
FIG. 5B is a graph for explaining the operation of the operation switch in related art.

Next, the operation of the operation switch 1 according to this embodiment as well as background to the present disclosure will be described. First, the problem of an operation switch in related art will be described using FIG. 5A and FIG. 5B. FIG. 5A is a plan view schematically illustrating the manner in which a water droplet 4 adheres to an operation switch 1x in related art. FIG. 5B is a graph for explaining the operation of the operation switch 1x in related art.

As illustrated in FIG. 5A, the operation switch 1x in related art includes only one detection electrode 12x. The operation switch 1x in related art generates an operation signal when the intensity of a detection signal outputted from the detection electrode 12x exceeds a predetermined threshold value th.

When a water droplet 4 adheres to the detection electrode 12x, the capacitance between the detection electrode 12x and the water droplet 4 is increased, and thus the intensity of a detection signal is increased. As illustrated in FIG. 5B, when the intensity of a detection signal exceeds a threshold value th, an operation signal is generated to cause the device 2 to be operated.

Since the operation switch 1x in related art is provided with only one detection electrode 12x like this, there is a problem in that the water droplet 4 and the human finger 3 cannot be distinguished, and even when the water droplet 4 adheres to the detection electrode 12x, the device 2 is caused to be operated.

Figure 6B:
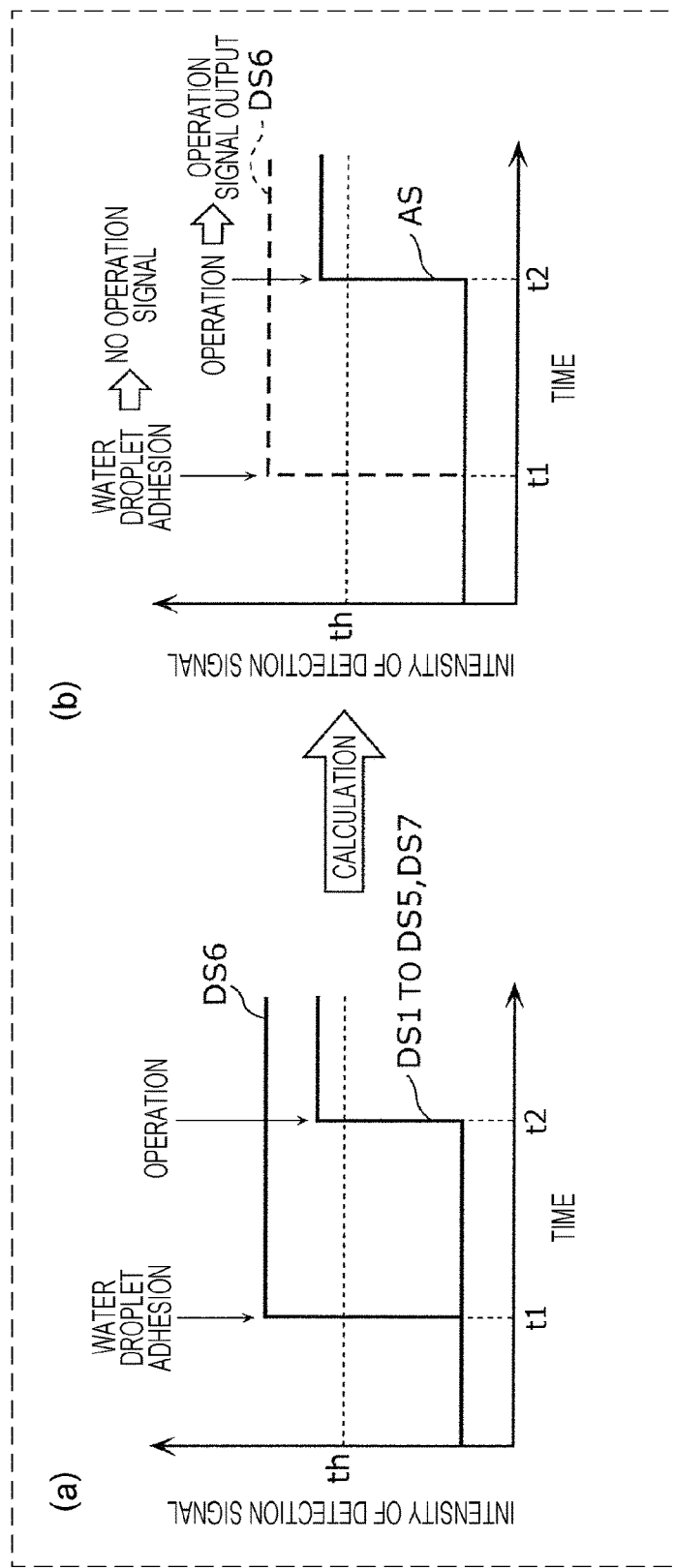
FIG. 6B illustrates graphs for explaining the operation of the operation switch according to the first embodiment.

FIG. 6A illustrates plan views schematically illustrating the manner (a) in which the water droplet 4 adheres to the operation switch 1 according to this embodiment and the manner (b) in which the operation switch 1 is operated with the finger 3. FIG. 6B illustrates graphs for explaining the operation of the operation switch 1 according to this embodiment.

As illustrated in FIG. 6A (a), the water droplet 4 comes into contact with the detection electrode 12f at time t1. Therefore, as illustrated in FIG. 6B (a), at time t1, the intensity of a detection signal DS6 from the detection electrode 12f is increased and exceeds the threshold value th.

In this embodiment, the determination circuit 20 determines whether or not the detection target is a living body based on other one or more detection signals excluding a signal having a maximum intensity, out of detection signals DS1 to DS7 outputted from the seven detection electrodes 12a to 12g, respectively. Specifically, when the intensity of an average signal obtained by averaging the other one or more detection signals exceeds the threshold value th, the determination circuit 20 determines that the detection target is a living body.

In the example illustrated in FIG. 6B (a), the intensity of the detection signal DS6 has a maximum at time t1. The determination circuit 20 determines whether or not the detection target is a living body based on all remaining detection signals DS1 to DS5 and DS7 excluding the detection signal D6 having a maximum intensity, out of the detection signals DS1 to DS7. Specifically, as illustrated in FIG. 6B (b), the determination circuit 20 generates an average signal AS by averaging the intensities of the detection signals DS1 to DS5 and DS7. Since the case has been described in which all the intensities of the detection signals DS1 to DS5 and DS7 are the same, the average signal AS is the same as the detection signal DS1 illustrated in FIG. 6B.

As illustrated in FIG. 6B (b), at time t1, the intensity of the average signal AS does not exceeds the threshold value th, and thus the determination circuit 20 determines that the detection target is not a living body. Thus, the controller 30 does not generate an operation signal.

Next, as illustrated in FIG. 6A (b), at time t2, the finger 3 of a user approaches or comes into contact with a plurality of detection electrodes 12 so as to cover the detection electrodes 12. For this reason, as illustrated in FIG. 6B (a), at time t2, the intensities of the detection signals DS1 to DS5 and DS7 from the remaining detection electrodes 12a to 12e and 12g are increased. Although for the detection signal DS6 if not saturated, the intensity is increased, here, the case is illustrated in which the intensity is not increased.

At time t2, the intensities of the remaining detection signals DS1 to DS5 and DS7 are increased, and thus the intensity of the average signal AS is also increased as illustrated in FIG. 6B (b). The intensity of the average signal AS exceeds the threshold value th, and thus the determination circuit 20 determines that the detection target is a living body. Thus, the controller 30 generates an operation signal, and the device 2 is operated.

As described above, even when the water droplet 4 adhered to one of the seven detection electrodes 12a to 12g, an operation signal is not generated, and thus it is possible to avoid malfunction of the device 2. When the finger 3 approaches and covers all (or the most part) of the seven detection electrodes 12a to 12g, an operation signal is generated, and thus the device 2 can be operated according to the intention of a user.

Modification of First Embodiment

Hereinafter, a modification of the first embodiment will be described.

In this modification, the determination circuit 20 determines whether or not the detection target is a living body based on other one or more detection signals excluding a signal having a maximum intensity and a signal having a minimum intensity, out of detection signals outputted from the three or more detection electrodes 12. That is, the modification differs from the first embodiment in that not only a signal having a maximum intensity but also a signal having a minimum intensity are excluded.

Figure 6C:
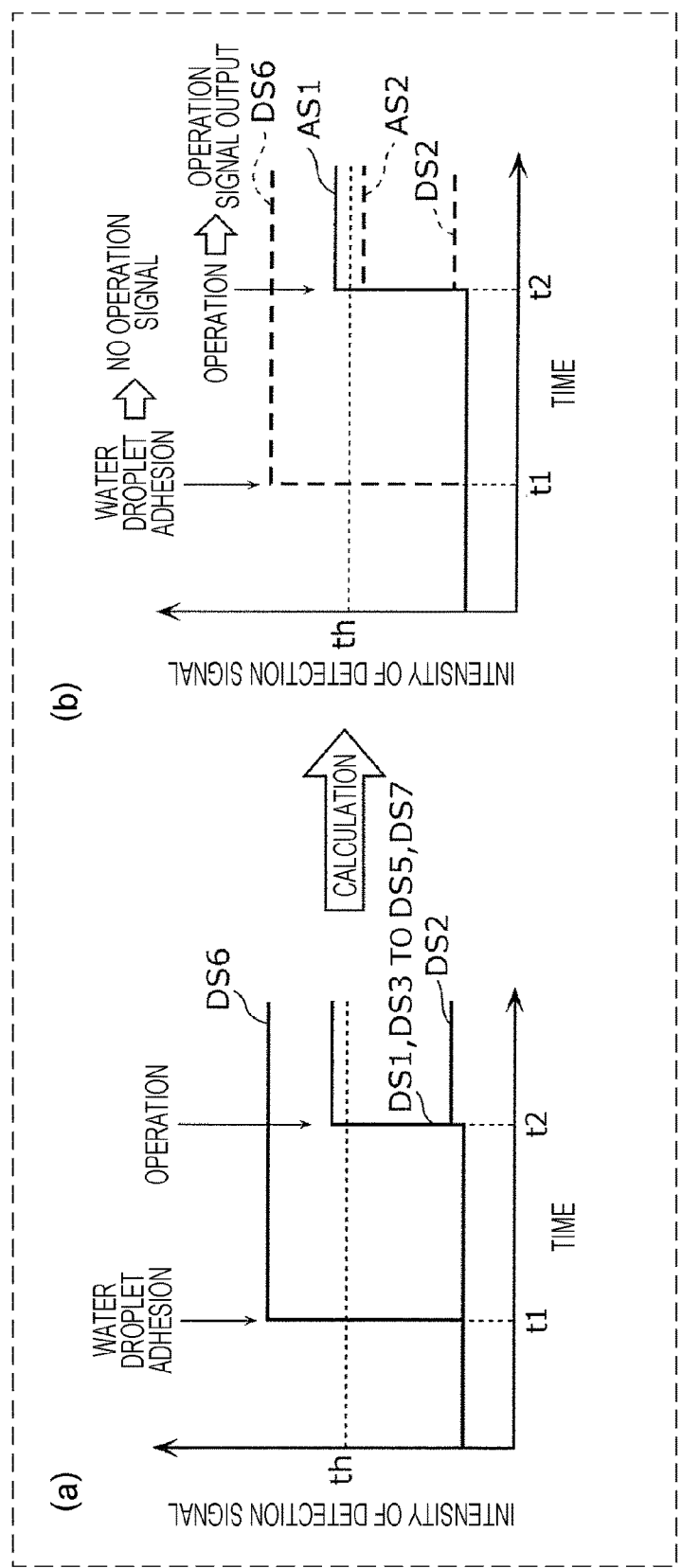
FIG. 6C illustrates graphs for explaining the operation of the operation switch according to a modification of the first embodiment.

In the example illustrated in FIG. 6B, in order to facilitate description, all the intensities of the detection signals DS1 to DS5 and DS7 follow the same behavior. Practically, the rates of increase in the intensities of the detection signals DS1 to DS5 and DS7 are varied depending on the distance to the finger 3. For instance, in the example illustrated of FIG. 6A (b), the detection electrode 12b is away from the finger 3. Thus, as illustrated in FIG. 6C (a), the intensity of the detection signal DS2 from the detection electrode 12b is not increased so much. FIG. 6C illustrates graphs for explaining the operation of the operation switch 1 according to this modification.

It is to be noted that as a comparative example, FIG. 6C (b) illustrates an average signal AS2 in the case where only the detection signal DS6 having a maximum intensity is excluded as in the first embodiment. Since the detection signal DS2 is used for calculation of the average signal AS2, the intensity of the average signal AS2 at time t2 is lower than an average signal AS1. Thus, the intensity of the average signal AS2 may not exceed the threshold value th, and an operation signal may not be generated. In this case, although a user operates the operation switch 1, the device 2 won't be operated.

On the other hand, in this modification, the determination circuit 20 determines whether or not the detection target is a living body based on the remaining detection signals DS1, DS3 to DS5 and DS7 excluding the detection signal DS6 having a maximum intensity and the detection signal DS2 having a minimum intensity. Specifically, the determination circuit 20 generates the average signal AS1 by averaging the intensities of the detection signals DS1, DS3 to DS5 and DS7. As illustrated in FIG. 6C (b), the intensity of the average signal AS1 exceeds the threshold value th at time t2, and thus an operation signal is generated.

As described above, with the operation switch 1 according to this modification, even when one detection electrode 12 (for instance, the detection electrode 12b) is unable to detect approach of the finger 3 and the intensity of a detection signal is not increased, a detection signal having a minimum intensity is excluded and is not used for determination as to whether or not the detection target is a living body. Therefore, the accuracy of determination as to whether or not the detection target is a living body is increased, and thus it is possible to avoid malfunction of the device 2. It is to be noted that not only the case where approach of the finger 3 is undetectable, but also the case where the sensitivity is decreased due to failure of one detection electrode 12, it is possible to avoid malfunction of the device 2.

Second Embodiment

Next, the operation switch according to a second embodiment will be described using FIG. 7 and FIG. 8.

Figure 7:
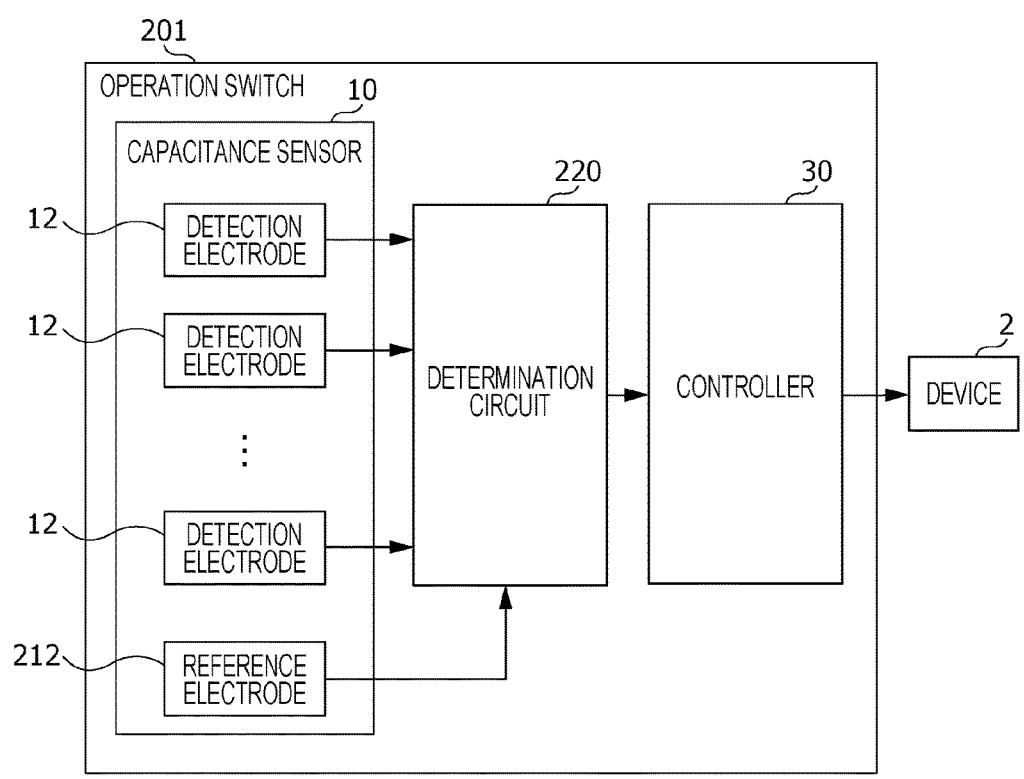
FIG. 7 is a block diagram illustrating the configuration of an operation switch according to a second embodiment.

FIG. 7 is a block diagram illustrating the configuration of an operation switch 201 according to this embodiment. FIG. 8 is a side view of a dressing table 100 including the operation switch 201 according to this embodiment.

As illustrated in FIG. 7, the operation switch 201 according to this embodiment differs from the operation switch 1 according to the first embodiment illustrated in FIG. 2 in that instead of the determination circuit 20, a determination circuit 220 is provided and a reference electrode 212 is newly provided. Hereinafter, the difference from the first embodiment will be described, and description of the same point is omitted or simplified.

The reference electrode 212 and the detection electrode 12 have the same configuration. That is, the reference electrode 212 outputs a detection signal for reference (in short, a reference signal) that indicates change in the capacitance generated between a detection target and the reference electrode 212. The detection target of the reference electrode 212 is the same as the detection target of the detection electrode 12, that is, a living body including a human body, and water.

The reference electrode 212 is disposed at a position away from the three or more detection electrodes 12. Specifically, the reference electrode 212 is disposed at a position which allows detection of approach or contact of a user 5 who operates the operation switch 201, and to which water is less likely to adhere compared with the detection electrode 12.

Figure 8:
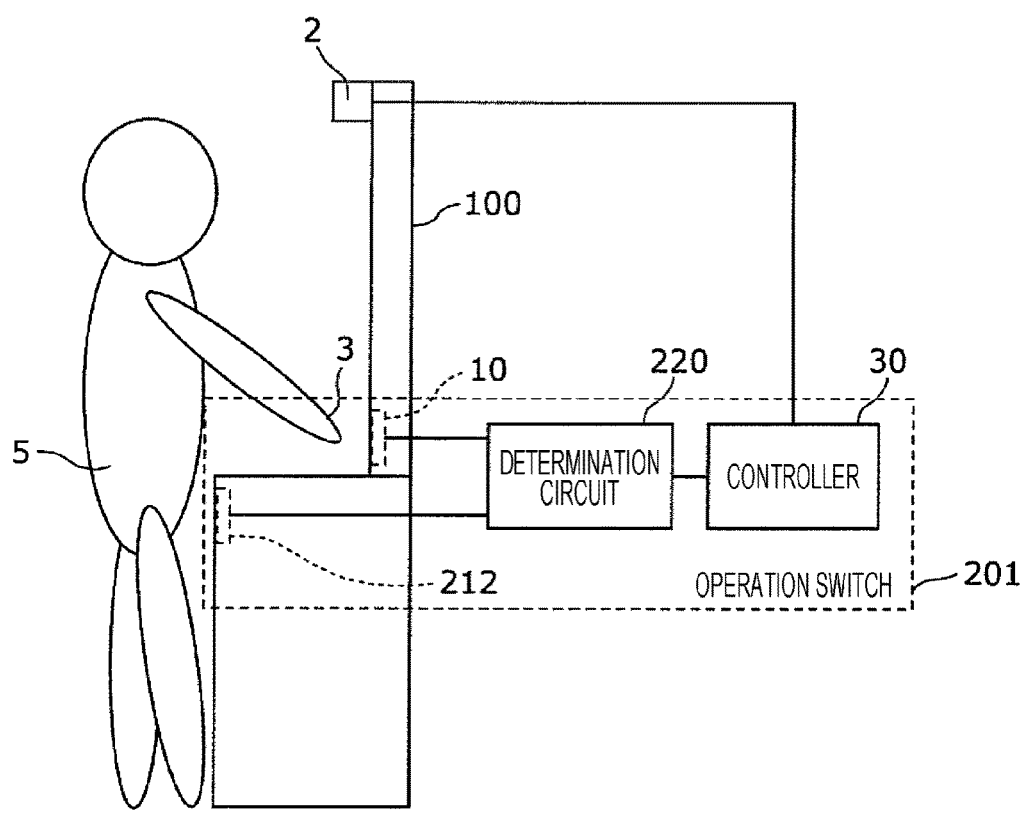
FIG. 8 is a side view of a dressing table including the operation switch according to the second embodiment.

For instance, as illustrated in FIG. 8, the reference electrode 212 is disposed at a front portion of the wash stand 120. When the user 5 utilizes the dressing table 100, the user 5 normally stands in front of the dressing table 100. Thus, the intensity of a detection signal for reference from the reference electrode 212 is increased due to approach of the waist, legs, knees of the user 5.

The determination circuit 220 determines whether or not the detection target is a living body based on other one or more detection signals excluding a detection signal having a maximum intensity and a detection signal for reference from the reference electrode 212, out of detection signals from the three or more detection electrodes 12 of the capacitance type sensor 10.

Specifically, similarly to the first embodiment, when the intensity of a detection signal for reference exceeds a predetermined threshold value, the determination circuit 220 makes determination as to the average signal and the threshold value th. It is to be noted that a threshold value used for determination of the detection signal for reference may be the same as or different from the threshold value th used for determination of the average signal.

Also, when the intensity of the detection signal for reference does not exceed a predetermined threshold value, the determination circuit 220 makes no determination as to the average signal and the threshold value th. Thus, when the intensity of the detection signal for reference does not exceed a predetermined threshold value, even if the intensity of the average signal exceeds the threshold value, the determination circuit 220 does not determine that the detection target is a living body. For this reason, when the intensity of the detection signal for reference does not exceed a threshold value, an operation signal is not outputted and the device 2 is not controlled. Even if the capacitance type sensor 10 detects a detection target in conditions where an operation of the user 5 is unlikely to be performed, for instance, when the user 5 is not standing in front of the dressing table 100, an operation signal is not outputted. Thus, it is possible to avoid malfunction of the device 2.

It is to be noted that arrangement of the reference electrode 212 is not limited to the aforementioned example. For instance, the reference electrode 212 may be provided in frame 111 or the mirror 110. In this case, eaves may be provided above the reference electrode 212 so that a water droplet does not adhere to the reference electrode 212.

Other Embodiments

Although the operation switch according to one or more aspects has been described based on the embodiments so far, the present disclosure is not limited to these embodiments. The embodiments to which various alterations which will occur to those skilled in the art are made, and an embodiment constructed by a combination of components of different embodiments without departing from the spirit of the present disclosure are also included within the scope of the present disclosure.

For instance, in the embodiments, as the detection target which may cause malfunction of the device 2, a water droplet, dew condensation, vapor have been mentioned. However, the detection target is not limited to these. Also, as the detection target to be detected correctly, a finger, a palm of a user have been mentioned. However, the detection target to be detected correctly is not limited to these. The detection target may be any object, as long as the capacitance changes between the detection electrode 12 and the object.

For instance, the determination circuit 20 may exclude not only a signal having a maximum intensity, but also a signal having the second highest intensity. In other words, the determination circuit 20 may exclude signals having the 1st to nth highest intensity, where n is a number smaller than the number of detection electrodes 12 included in the capacitance type sensor 10. The same goes with the case where a minimum signal is excluded.

For instance, in the embodiments, comparison is made between the threshold value th and the intensity of an average signal obtained by averaging the remaining detection signals excluding a detection signal having a maximum intensity. However, without being limited to this, for instance, weighted addition with increased weight of the detection signal DS7 may be performed so that the detection electrode 12g located in the center is assigned high importance.

For instance, in the embodiments, the example has been illustrated in which the operation switch 1 is provided in the frame 111 of the mirror 110. However, the mirror 110 may include the operation switch 1.

Figure 9:
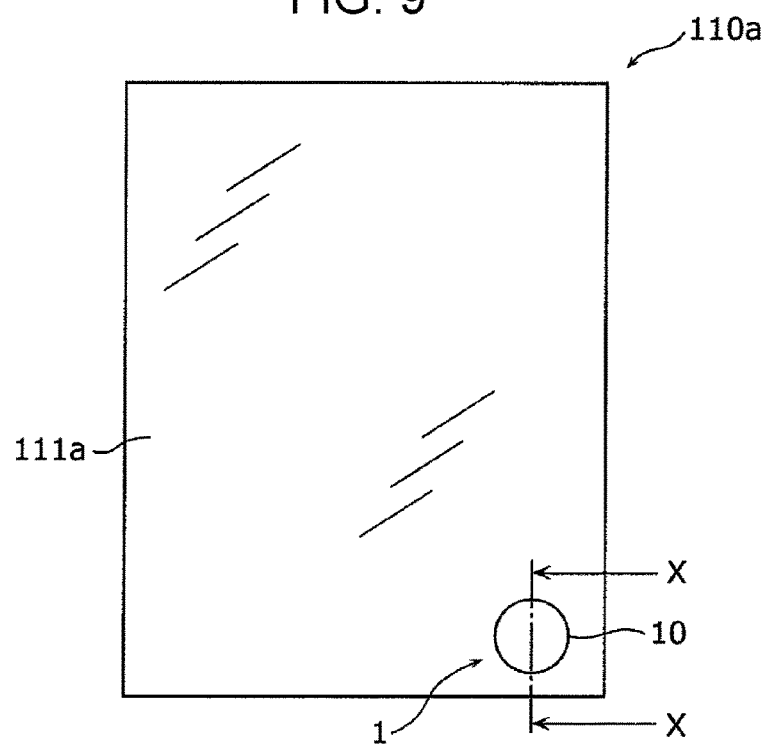
FIG. 9 is a plan view of a mirror including the operation switch according to the modification.
Figure 10:
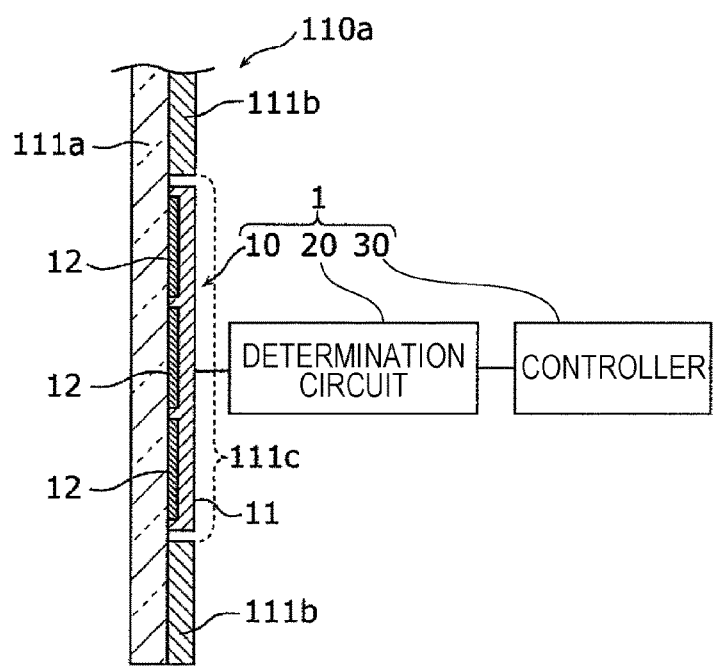
FIG. 10 is a sectional view, taken along line X-X of FIG. 9, of the mirror according to the modification.

FIG. 9 is a plan view of a mirror 110a including the operation switch 1 according to this modification. FIG. 10 is a sectional view, taken along line X-X of FIG. 9, of the mirror 110a according to this modification.

As illustrated in FIG. 10, the mirror 110a includes a transparent layer 111a that allows visible light to pass through, and a reflective metal layer 111b that reflects visible light. The transparent layer 111a is, for instance, a glass substrate. The reflective metal layer 111b is formed by depositing a metal film such as silver or aluminum on the surface of the glass substrate. The surface (surface facing the transparent layer 111a) of the reflective metal layer 111b is a specular surface. Thus, the mirror 110a can reflect the figure of a user. It is to be noted that a non-conductive material (for instance, a half mirror) may be used for the reflective metal layer 111b. In this case, the capacitance type sensor 10 may be disposed without machining the specular surface.

As illustrated in FIG. 9, the operation switch 1 is provided in part of the mirror 110a. Specifically, as illustrated in FIG. 10, the capacitance type sensor 10 of the operation switch 1 is disposed in an opening 111c provided in part of the reflective metal layer 111b. In other words, the metal layer, facing the sensor surface, of the capacitance type sensor 10 is removed. Thus, the detection electrode 12 of the capacitance type sensor 10 can detect a finger which comes into contact with or approaches the transparent layer 111a.

It is to be noted that similarly to the embodiments, the operation switch 1 controls the device 2 (not illustrated in FIG. 9 and FIG. 10). For instance, when the mirror 110a is installed at a predetermined position, the controller 30 is connected to a light fixture or the like located nearby to control the light fixture. Alternatively, for the purpose of preventing fog of the mirror 110a, the back surface (the surface facing the reflective metal layer 111b) of the mirror 110a may be provided with an electrically heated wire or the like. The operation switch 1 may control supplying and stopping of power to the electrically heated wire. In other words, the operation switch 1 may be a switch that switches between ON/OFF of fog prevention function of the mirror 110a.

Various modifications, replacements, additions, and omissions may be made to the embodiments described above within the scope of the claims and the scope of the equivalents thereof.

Overview of Embodiments

The operation switch according to an aspect of the present disclosure includes: a capacitance type sensor having three or more detection electrodes, each of which outputs a detection signal indicating change in the capacitance generated between a detection target and the detection electrode; a determination circuit that determines whether or not the detection target is a living body based on other one or more detection signals excluding a signal having a maximum intensity, out of detection signals outputted from the three or more detection electrodes; and a controller that, when the detection target is determined to be a living body by the determination circuit, generates an operation signal for operating a predetermined device.

Thus, for instance, even when a small detection target such as a water droplet approaches or comes into contact with one detection electrode, and the intensity of a detection signal from the detection electrode is increased, the detection signal is excluded, and is not used for determination as to whether or not the detection target is a living body. Therefore, the accuracy of determination as to whether or not the detection target is a living body is increased, and thus it is possible to avoid malfunction of the device.

For instance, the determination circuit may determine whether or not the detection target is a living body based on other one or more detection signals excluding a signal having a maximum intensity and a signal having a minimum intensity, out of detection signals outputted from the three or more detection electrodes.

For instance, when the sensitivity of one detection electrode is reduced due to a failure or the like, even if a hand of a user approaches or comes into contact with the detection electrode, the intensity of a detection signal from the detection electrode is not increased. Depending on the position of a hand of a user, a situation may occur in which the one detection electrode is unable to detect approach of a hand, and thus the intensity of a detection signal is not increased. In this case, with the operation switch according to this aspect, a detection signal having a minimum intensity is excluded, and is not used for determination as to whether or not the detection target is a living body. Therefore, the accuracy of determination as to whether or not the detection target is a living body is increased, and thus it is possible to avoid malfunction of the device.

For instance, when the intensity of an average signal obtained by averaging the other one or more detection signals exceeds a threshold value, the determination circuit may determine that the detection target is a living body.

Thus, by averaging the remaining detection signals excluding a detection signal having a maximum intensity, a variation between the detection signals can be reduced. Therefore, the accuracy of determination as to whether or not the detection target is a living body is increased, and thus it is possible to avoid malfunction of the device.

For instance, the detection target may include a living body including a human body, and water.

Thus, for instance, when a water droplet adheres to one detection electrode, the intensity of a detection signal from the detection electrode to which a water droplet has adhered is increased, and thus the detection signal is excluded. Since the intensity of a detection signal from each of the remaining detection electrodes remains low, an operation signal for operating the device is not generated. On the other hand, for instance, when a user puts its finger or palm closer to the operation switch to operate it, the intensities of detection signals from all the three detection electrodes (or the most part) are increased. Therefore, the intensities of the remaining detection signals excluding a signal having a maximum intensity are also increases, and thus an operation signal is generated. In this manner, with the operation switch according to this aspect, the accuracy of determination as to whether the detection target is water or human is increased, and thus it is possible to avoid malfunction of the device.

For instance, the operation switch according to an aspect of the present disclosure may further include a reference electrode that is disposed at a position away from the three or more detection electrodes, and that outputs a detection signal indicating change in the capacitance generated between the detection target and the detection electrode. The determination circuit may determine whether or not the detection target is a living body based on the other one or more detection signals and the detection signal for reference.

Thus, for instance, the reference signal from a reference electrode indicates approach or contact of a detection targets other than water, and thus the accuracy of determination as to whether the detection target is water or human is increased. Thus, with to the operation switch according to this aspect, it is possible to avoid malfunction of the device.

The dressing table according to an aspect of the present disclosure includes the operation switch.

Thus, the operation switch is included, and it is possible to avoid malfunction of the device. The dressing table according to this aspect is particularly useful when utilized for a bathroom vanity to which water is likely to adhere, for instance.

The present disclosure can be utilized for an operation switch that can avoid malfunction of the device, and is applicable to various switches used in, for instance, a bathroom, a wash stand, a toilet, a kitchen, a dressing table to which a water droplet is likely to adhere.

What is claimed is:

1. An operation switch comprising:
   a capacitance sensor, including three or more electrodes, configured to generate three or more detection signals in response to approach or contact of an object to the respective three or more electrodes;
   a determination circuit that determines whether or not the object is a living body based on one or more detection signals selected from the three or more detection signals, the one or more detection signals excluding a detection signal having a maximum intensity among the three or more detection signals; and
   a controller that, when the object is determined to be a living body, generates an operation signal for operating a predetermined device.

2. The operation switch according to claim 1,
   wherein the one or more detection signals further exclude a detection signal having a minimum intensity among the three or more detection signals.

3. The operation switch according to claim 2,
   where the one or more detection signals are a plurality of detection signals, and
   when an average value of intensities of the plurality of detection signals exceeds a threshold value, the determination circuit determines that the object is a living body.

4. The operation switch according to claim 1,
   wherein the living body is a human body.

5. The operation switch according to claim 1,
   wherein the capacitance sensor further includes a reference electrode, and generates a reference signal in response to approach or contact of the object to the reference electrode, and
   the determination circuit determines whether or not the object is a living body based on the reference signal and the one or more detection signals.

6. The operation switch according to claim 1,
   wherein the predetermined device is a light device, audio device, or air conditioner.

7. The operation switch according to claim 1,
   wherein the predetermined device is a light device, and the operation signal is a signal for controlling light of the light device.

8. A dressing table comprising the operation switch according to claim 1.

9. A mirror comprising the operation switch according to claim 1.

* * * * *